United States Patent
Bartels et al.

(10) Patent No.: US 10,468,872 B1
(45) Date of Patent: *Nov. 5, 2019

(54) METHOD AND APPARATUS FOR RAPIDLY AND DYNAMICALLY ADJUSTING CURRENT LIMITING IN A PORTABLE COMMUNICATION DEVICE

(71) Applicant: MOTOROLA SOLUTIONS, INC, Chicago, IL (US)

(72) Inventors: Peter J. Bartels, Loxahatchee, FL (US); Javier Alfaro, Miami, FL (US); Hugo Garcia, Miami Springs, FL (US); Kevin Alonso, Davie, FL (US); Stephen C. Glass, Plantation, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/289,207

(22) Filed: Feb. 28, 2019

Related U.S. Application Data

(63) Continuation of application No. 16/048,400, filed on Jul. 30, 2018, now Pat. No. 10,263,415.

(51) Int. Cl.
*H04B 1/38* (2015.01)
*H02H 9/02* (2006.01)
(Continued)

(52) U.S. Cl.
CPC ............ *H02H 9/02* (2013.01); *H02H 1/0007* (2013.01); *H03F 3/183* (2013.01); *H03F 3/19* (2013.01);
(Continued)

(58) Field of Classification Search
CPC .. H04M 1/73; H04M 1/7253; H04M 2250/12; H04W 4/10; H04W 4/80;
(Continued)

(56) References Cited

U.S. PATENT DOCUMENTS 5,263,092 A 11/1993 Jang
6,809,504 B2 10/2004 Tang et al.
(Continued)

FOREIGN PATENT DOCUMENTS

JP 2006148671 6/2006
WO 0011781 3/2000

OTHER PUBLICATIONS

Nagari et al. "An 8 Omega 2.5 W1%-THD 104 dB(A)-Dynamic-Range Class-D Audio Amplifier With Ultra-Low EMI System and Current Sensing for Speaker Protection," IEEE Journal of Solid-State Circuits, IEEE Service Center, Piscataway, NJ, USA, vol. 47, No. 12,1 (Dec. 1, 2012) pp. 3068-3080, XP011485432, ISSN: 0018-9200, DOI: 10.1109/JSSC.2012.2225762, Chapters I and II; abstract; figure 1.

*Primary Examiner* — Quochien B Vuong
(74) *Attorney, Agent, or Firm* — Barbara R. Doutre

(57) ABSTRACT

A battery operated portable communication device provides converged functionality while avoiding resets to the device. Composite logic circuitry formed of at least one comparator and a logic interface controls current limiting to a primary load formed of high power land mobile radio (LMR) devices and programming to secondary loads formed of non-LMR peripherals. At least one current limit control signal is used to control current to the primary load under high current mode operations. Another control signal provides an interruption alert to a slave processor for controlled programming of the secondary loads during the high current operations of the primary load. Current to the primary load is restored while the secondary load is interrupted. Operation of secondary load processes is resumed when the primary load ceases high power operation.

17 Claims, 8 Drawing Sheets

(51) Int. Cl.
  *H02H 1/00* (2006.01)
  *H03F 3/183* (2006.01)
  *H03F 3/19* (2006.01)
  *H03F 3/24* (2006.01)

(52) U.S. Cl.
  CPC ........ *H03F 3/245* (2013.01); *H03F 2200/451* (2013.01)

(58) Field of Classification Search
  CPC ............ H04W 24/04; H04W 52/0225; H04W 52/0258; H04W 88/02; H04B 1/3833
  USPC ............................ 455/90.2, 556.1, 557, 574
  See application file for complete search history.

(56) References Cited

U.S. PATENT DOCUMENTS

| | | |
|---|---|---|
| 6,853,242 B2 | 2/2005 | Melanson et al. |
| 7,550,975 B2 | 6/2009 | Honda et al. |
| 7,697,704 B2 | 4/2010 | Brooks et al. |
| 7,782,018 B2 | 8/2010 | Voigt |
| 8,295,950 B1 | 10/2012 | Wordsworth et al. |
| 8,619,653 B2 | 12/2013 | Ji et al. |
| 8,843,774 B2 | 9/2014 | Chen et al. |
| 9,075,090 B2 | 7/2015 | Zimmerman et al. |
| 9,131,452 B2 | 9/2015 | Bartels et al. |
| 9,374,787 B2 | 6/2016 | Delind Van Wijngaarden et al. |
| 9,472,967 B2 | 10/2016 | Nunez et al. |
| 2006/0247920 A1 | 11/2006 | Toriyama |
| 2007/0244587 A1 | 10/2007 | Yamamoto |
| 2008/0016070 A1 | 1/2008 | Ogawa et al. |
| 2012/0101640 A1 | 4/2012 | Stapelfeldt |
| 2016/0036260 A1 | 2/2016 | Nunez et al. |

METHOD AND APPARATUS FOR RAPIDLY AND DYNAMICALLY ADJUSTING CURRENT LIMITING IN A PORTABLE COMMUNICATION DEVICE

RELATED APPLICATIONS

This application is related to co-pending application Ser. No. 16/048,391, commonly assigned to Motorola Solutions Inc.

FIELD OF THE INVENTION

This application pertains to portable communication devices and more particularly to limiting high current transients within such devices.

BACKGROUND OF THE INVENTION

Portable battery powered communication devices are often utilized in public safety environments, such as law enforcement, fire rescue, and the like, to provide mission critical communications operating over a public safety platform, such as a land mobile radio (LMR) platform. There is an increased desire to expand the functionality of public safety communication devices to incorporate additional features that run on different operating platforms, other than the main LMR public platform. Adding features that operate on different platforms increases the possibility of potential conflict occurring as a result of accessing multiple features concurrently. Certain features are considered mission critical functions to a public safety communication device, and maintaining operation of these mission critical features is imperative. Excessive transient current demands on the battery may reset an entire device, causing a loss in communication. Hence, excessive transient power loading remains a challenge to be addressed in new portable battery powered devices incorporating an increased number of features. Improved power management approaches are needed. Size, cost, and weight are all relevant considerations to such power management approaches. For example, adding more battery cells is considered undesirable due the impact on cost, size, and weight of the product. Additionally, the ability to retain mission critical functionality is very important to public safety usage. Accordingly, there is need for a method and apparatus that can rapidly and dynamically address current transients in a portable battery powered communication device.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
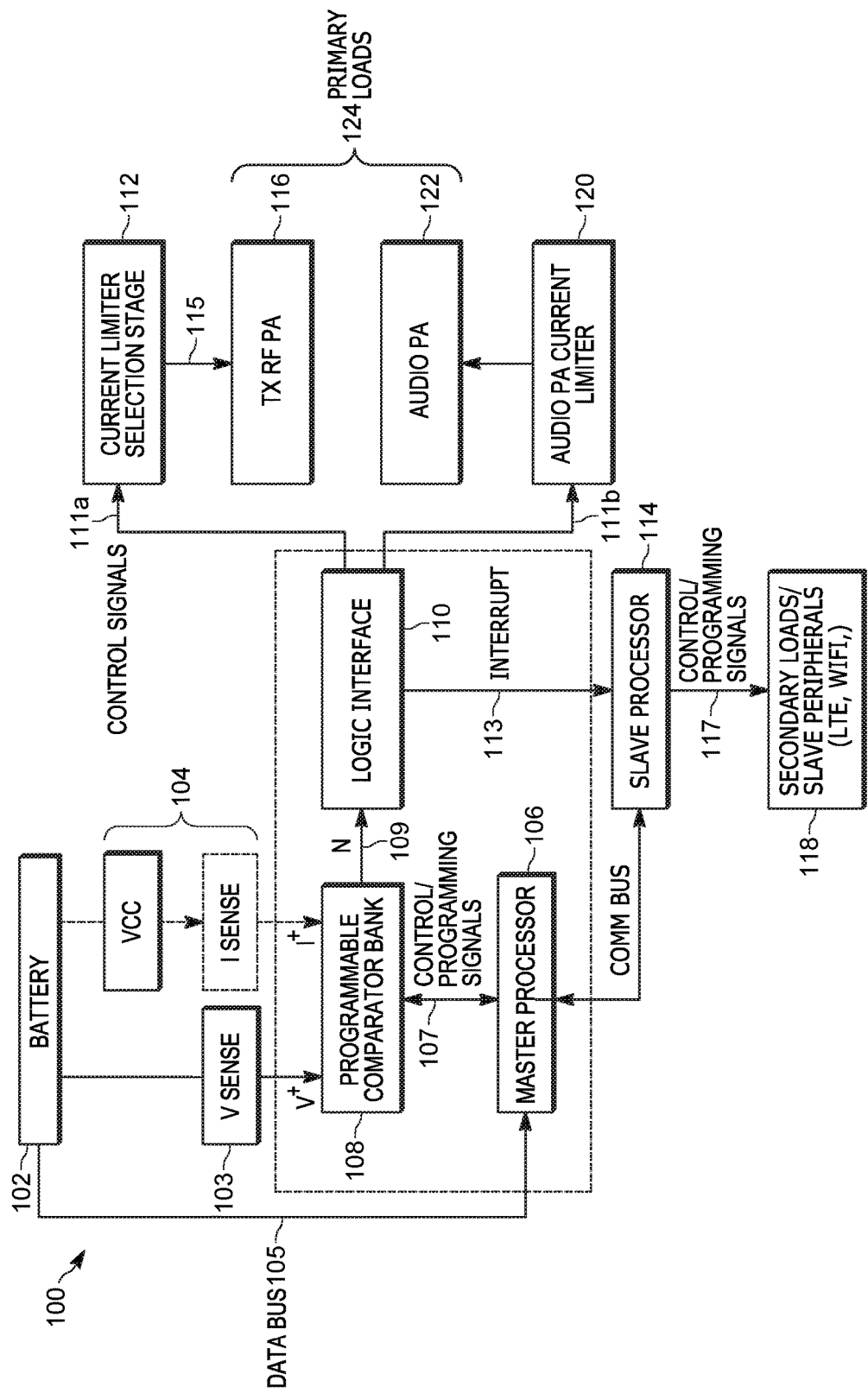
FIG. 1 is block diagram of a portable communication device formed and operating in accordance with a first embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Briefly, there is provided herein a method and apparatus for dynamically adjusting current limiting in a portable communication device. The current limiting provided herein is provided by first and second embodiments. Both embodiments provide for a scaled gradation of current limiting control which aligns loading on the battery according to the battery profile. Controlled scaling back of high power current drain devices in combination with controlled interruption to peripheral devices advantageously enable a-portable battery operated land mobile radio (LMR) device to expand its functionality to non-LMR functions, such as long term evolution (LTE), WiFi, and global positioning system (GPS), to name a few. Priority to mission critical high current LMR functions is maintained, particularly transmit push-to-talk (PTT) functionality and high audio PA transmit alert tones. For the purposes of this application, peripheral devices (also referred to as peripherals) are non-LMR functions which are non-mission critical.

In a first embodiment to be described herein, in accordance with FIGS. 1, 2, 3, 4, 5 and FIG. 9, a bank of comparators and array of logic gates are managed, via a master processor, to control signal flows and thresholds in a manner that limits the high current load of a transmit radio frequency power amplifier (Tx RFPA), Audio PA, slave processor and slave processor peripherals (LTE, WiFi, etc.) in response to predetermined events occurring at the same time as a transmit event that would otherwise cause an over current condition.

In a second embodiment to be described herein, in accordance with FIGS. 6, 7, 8, and FIG. 9, the current of a subsystem of a radio device's slave processor is sensed and monitored by a single comparator, the single comparator generating an output that goes to a current limiting state machine. When a transmit event occurs, the state machine transitions to a maximum current limiting state in which all high current draw devices (Tx RFPA, Audio PA, slave processor and slave processor peripherals) are limited. Once the current of the sensed subsystem drops as a result of this maximum limiting, the single comparator output then goes low and the state machine transitions to a moderate current limiting state. In the moderate current limiting state, the Tx RFPA limit is removed in order to achieve full transmit power and avoid any effect on LMR mission critical operation. Once the transmit event has concluded, the state machine transitions to a normal operating state in which all devices will have previous limits removed. In order to further prevent transient responses, timers are used within each state to ensure the states do not change before a predetermined time has expired.

Both embodiments advantageously provide for the combination of peripheral functions in a modern LMR radio. The first embodiment provides for current limiting action to take place in response to both the PTT being pressed and the comparator being tripped. The second embodiment provides current limiting action to take place by putting the device into a maximum current limit state in response to the PTT being pressed and then reading the current sensing of a branch of the slave processor and its secondary loads to determine whether to change states or remain in the maximum current limiting state.

Referring now to FIG. 1, there is shown a block diagram of a portable communication device 100 formed and operating in accordance with the first embodiment. The portable communication device 100 is a converged device providing LMR functionality operated from a master processor 106, and additional non-LMR peripheral functionality controlled by a slave processor 114. Mission critical LMR functionality is provided by high power LMR elements, such as a transmit radio frequency power amplifier (Tx RFPA) 116 and audio power amplifier (Audio PA) 122. Such high power mission critical LMR functions under the control of master processor 106 will also referred to as primary loads 124. Secondary loads 118 are managed by the slave processor 114 and comprise one or more slave peripherals which are non-LMR functions, such as slave processor core clock, LTE, WiFi, and GPS to name a few.

The portable communication device 100 is powered by a battery 102 having a battery profile associated therewith. The battery 102 provides a battery voltage that supplies power to a plurality of radio elements, either directly or indirectly. The portable communication device 100 is controlled via the master processor 106, the master processor being uploaded with the battery profile via a battery data bus 105. In accordance with this first embodiment, a comparator bank 108, which comprises at least one comparator, is dynamically programmed with comparator trip thresholds by the master processor 106 based on the uploaded battery profile.

In accordance with the first embodiment, the comparator bank 108 is configured to monitor for high current transients on the battery 102. Monitoring for high current transients on the battery 102 may be based on one or more measured battery parameters. The measured battery parameter may comprise an instantaneous voltage measurement, V sense 103, which determines instantaneous slumps on the battery voltage occurring within a predetermined time. Alternatively, the battery measurement for sensing high current transients may be an instantaneous current measurement sensed at a predetermined high power branch 104 of the portable communication device associated with high current peaks, such as the Tx RFPA 116 and/or the audio PA 122.

The comparator bank 108 generates a comparator output control signal (N) 109 in response to the comparisons made between the battery parameter measurement and the comparator trip thresholds. The comparator output control signal (N) 109 is provided as an input to a logic interface 110. For embodiments in which the comparator bank 108 is configured with a plurality of comparators, the logic interface 110 is configured with an array of corresponding logic gates as will be described in further detail in conjunction with FIG. 3. In accordance with the first embodiment, current limiting is dynamically controlled via the programmable comparator bank 108 and logic interface 110. As a side note, for the second embodiment to be described later, the management of current limiting is controlled via a single comparator and a finite state machine (FSM).

Continuing to refer to FIG. 1, in accordance with the first embodiment, the logic interface 110 generates a plurality of control signals 111a, 111b, 113 comprising at least one Tx RFPA current limiter control signal 111a, at least one Audio PA current limiter control signal 111b, and a slave processor interrupt control signal 113. The comparator bank 108 and logic interface 110 may also be configured to generate additional control lines for further scaling of the Tx RFPA 116 and/or the Audio PA 122.

The Tx RFPA current limiter control signal 111a is used to control a current limiter selection stage 112 for the Tx RFPA 116. The current limiter selection stage 112 which will also referred to be referred to as Tx RFPA current limiter selection stage 112. In accordance with the first embodiment, the Tx RFPA current limiter selection stage 112, in response to the Tx RFPA current limiter control signal 111a, controls a current supply to the Tx RFPA 116. The Tx RFPA current limiter select stage 112 may be configured in hardware, an example of which will be discussed later in conjunction with FIG. 3C. Again, the Tx RFPA 116 is a high power function which is also considered a mission critical LMR function.

The Audio PA current limiter control signal 111b is used to control a current limiter 120 for the Audio PA 122. The Audio PA current limiter 120 may be configured in hardware or in a digital signal processor (DSP). The hardware approach can, for example, be implemented similarly to the resistor network used for the Tx RF PA. Alternatively, the Audio PA (an integrated circuit) may have a pin that when driven low, clips the audio waveform thus reducing current draw.

The slave processor interrupt control signal 113 is a command which reduces a core clock rate of the slave processor 114 which in turn reduces power, via control and programming signals 117 to the slave peripherals 118, such as LTE and Wifi, thereby causing a reduction in overall peak power consumption of peripheral devices.

In accordance with the first embodiment, the slave processor 114 operates the peripheral non-LMR functions in parallel with the master processor 106 operating LMR functions during non-high power LMR modes. During high power LMR modes, if a conflict occurs based on a sensed high current transient, the comparator bank 108 is managed to progressively trip and generate the Tx RFPA current limiter control signal 111a, the Audio PA current limiter control signals 111b, and the slave processor interrupt signal 113 suitable to the present loading conditions. The composite of comparator bank 108 and logic interface 110 reduces loading on the battery 102 caused by non-mission critical functions and restores full current operation to mission critical functions of the portable communication device 100.

Various combinations of primary load current limiting and controlled secondary interruption provide for advantageous power management without resets. Using the embodiments provided by the first embodiment, the master processor 106 programs threshold levels to the comparator bank 108, based on battery characteristics read from data bus 105. The threshold levels are programmed via data signals 107 to comparator bank 108. The threshold levels are programmed to detect excessive current drain on the battery 102. In response to excessive current drain being detected at comparator bank 108, the comparator generates the comparator output control signal 109 which is input to the logic interface 110 to dynamically control the high current loads.

As an example, consider the battery powered portable communication device 100 providing both LMR and LTE platforms, in which the radio is performing an LTE data upload during a LMR RF PA operation in which a push-to-talk (PTT) button is pressed by a user. The Tx RFPA current and audio tone alerts associated with LMR transmit operations overlap and push the battery discharge rate to its predetermined current limit. In response, the comparator bank 108 generates the comparator output control signal 109 to the logic interface 110. The logic interface 110 generates current limiter control signal 111a to the current limiter selection stage 112 which reduces the current supply to the Tx RF PA 116 until the slave processor 114 has limited its current draw and the current sensing while the slave processor 114 responds to the interrupt control signal 113 and throttles down the LTE data rate to idle. In response to the LTE idling, the maximum current limit of the LMR Tx RFPA 116 is restored. In response to the audio tone subsiding or the PTT being released, then the interrupt control signal 113 that is applied to the slave processor 114 is de-asserted to resume maximum data throughput on the LTE uplink.

Figure 2:
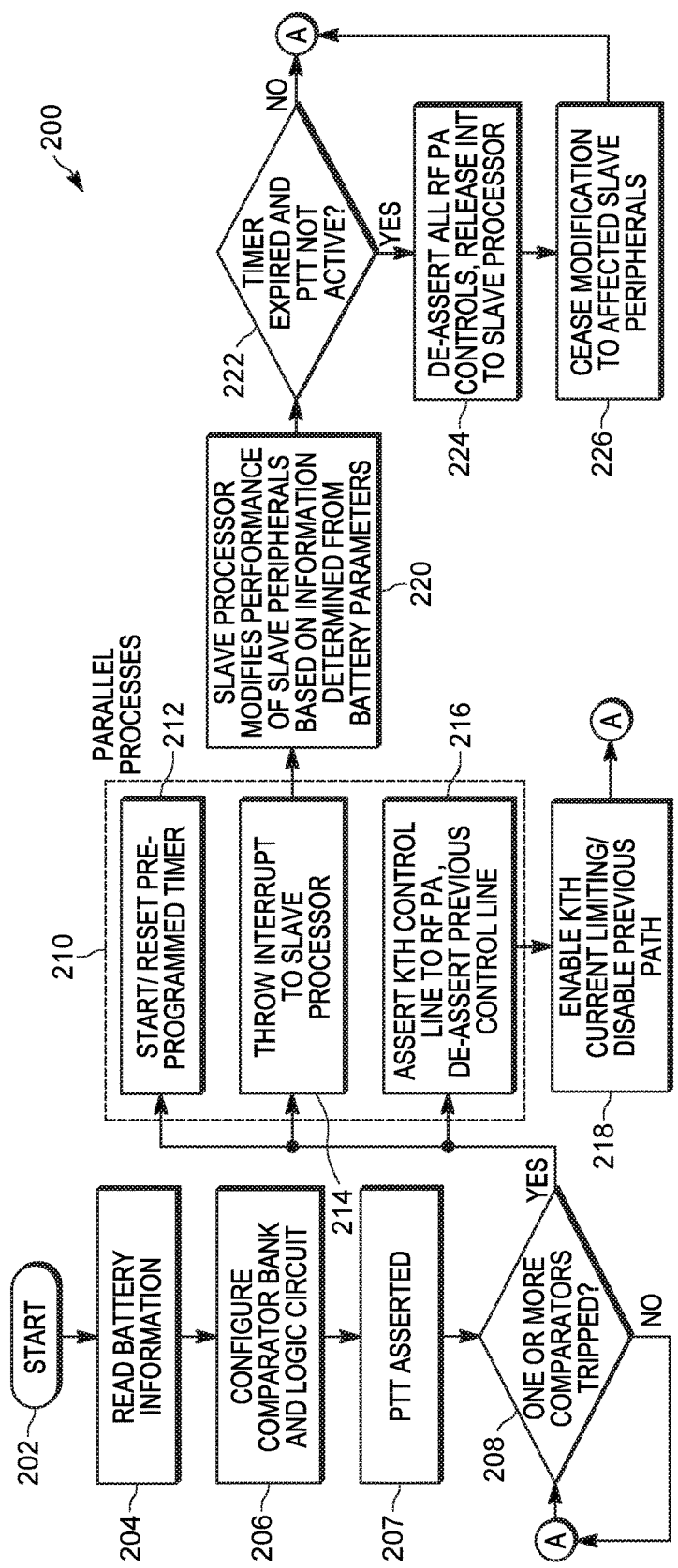
FIG. 2 is a flowchart of a method for managing the portable communication device in accordance with the first embodiment.

FIG. 2 is a flowchart of a method 200 for managing a battery operated portable communication device in accordance with the first embodiment. The method 200 provides rapidly and dynamically adjusting current limiting in the portable communication device of FIG. 1. The method 200 advantageously allows LMR operation and peripheral functions, such as non-LMR LTE, WiFi, and GPS processes, to be managed in a parallel and seamless manner which avoids resets to the radio. Briefly, in accordance with the first embodiment, current limiting actions are taken when both the PTT is pressed and the comparator trips.

The method 200 begins at 202 by reading battery information at 204 and configuring a comparator bank and logic interface at 206, based on the battery information. The battery information may comprise, for example, battery type, discharge rate capability, voltage, temperature, impedance, aging and/or other battery parameter profile information. The battery information is read by the master processor 106 of FIG. 1. The battery information is used by the master processor to set a plurality of trip thresholds for the comparator bank. The battery voltage is sensed and provided to the comparator bank for comparison to the thresholds to detect instantaneous changes in voltage resulting from large current spikes on the battery.

The method 200 monitors the assertion of a PTT press at 206 and, in response to the PTT being asserted, further monitors for one or more tripped comparators at 208. Instantaneous changes in voltage result in one or more of the comparators within the comparator bank being tripped at 208. When at least one of the comparators has tripped, the method moves to a plurality of parallel processes 210.

The plurality of parallel processes 210 comprises starting or resetting a pre-programmed timer at 212, throwing an interrupt control signal to the slave processor at 214, and asserting a ($K^{th}$) control line to a high power element and de-asserting any previous control line to that high power element at 216, such as the Tx RF PA.

Throwing the interrupt to the slave processor at 214 results in modifying the performance of slave peripheral functions based on battery parameters determined from the battery information at 220. For example, LTE applications may be disabled during a high power draw of the TX RFPA or Audio PA. The assertion of the control line at 216 enables current limiting to the Tx RF PA at 218 and disabling current limiting occurring on a previous path. The enabling of a (kth) current limiting and disabling a previous path advantageously provides scalability of the current limiting. Once the current limiting is applied to the Tx RFPA at 218, the method returns to 208 to monitor for additional comparators being tripped as a result of other instantaneous voltage changes within a predetermined time period set by a timer.

A check is made at 222 for timer expiration and push-to-talk (PTT) release. Releasing the PTT at 222 releases the high current mode. The conditions of the PTT remaining pressed and the timer not expiring at 222 are indicative of the portable device remaining in a high power mode, which causes the method to return to monitor whether additional comparators have been tripped at 208. Additional comparators would be tripped as a result of continued current spikes pulling down the voltage. Continued tripping of the comparator threshold will further current limit the high power elements, such as the RF PA, and possibly additional high power elements such as the Audio PA controlled by the master processor, as well as further interrupt and disable additional peripheral functions controlled by the slave processor. For example, the RF PA may be current limited to 2 amps and the slave processor may disable WiFi apps and GPS apps in addition to LTE apps, during the continued high power mode operation of the RF PA and/or audio PA.

When the PTT is released and the timer has expired at 222, the portable device is no longer in a high power mode which results in de-asserting current limiting controls to the high power devices, such as the RF PA, and to further releasing the interrupt control to the slave processor at 224 thereby ceasing modifications to the slave peripheral functions at 226. The method returns to 208 for monitoring one or more tripped comparators. Alternatively, the current limiting may have already been disabled to the TX RFPA if the battery permits, even though secondary applications are still current limited.

Accordingly, method 200 has provided control to at least two processors so that the processors can take mitigating action by scaling down power consumption of secondary loads and lower priority processes, under control of the slave processor, in a manner conducive to restoring a default current limit of the primary load(s), for example the RFPA and/or audio PA, under control of the master processor.

Figure 3:
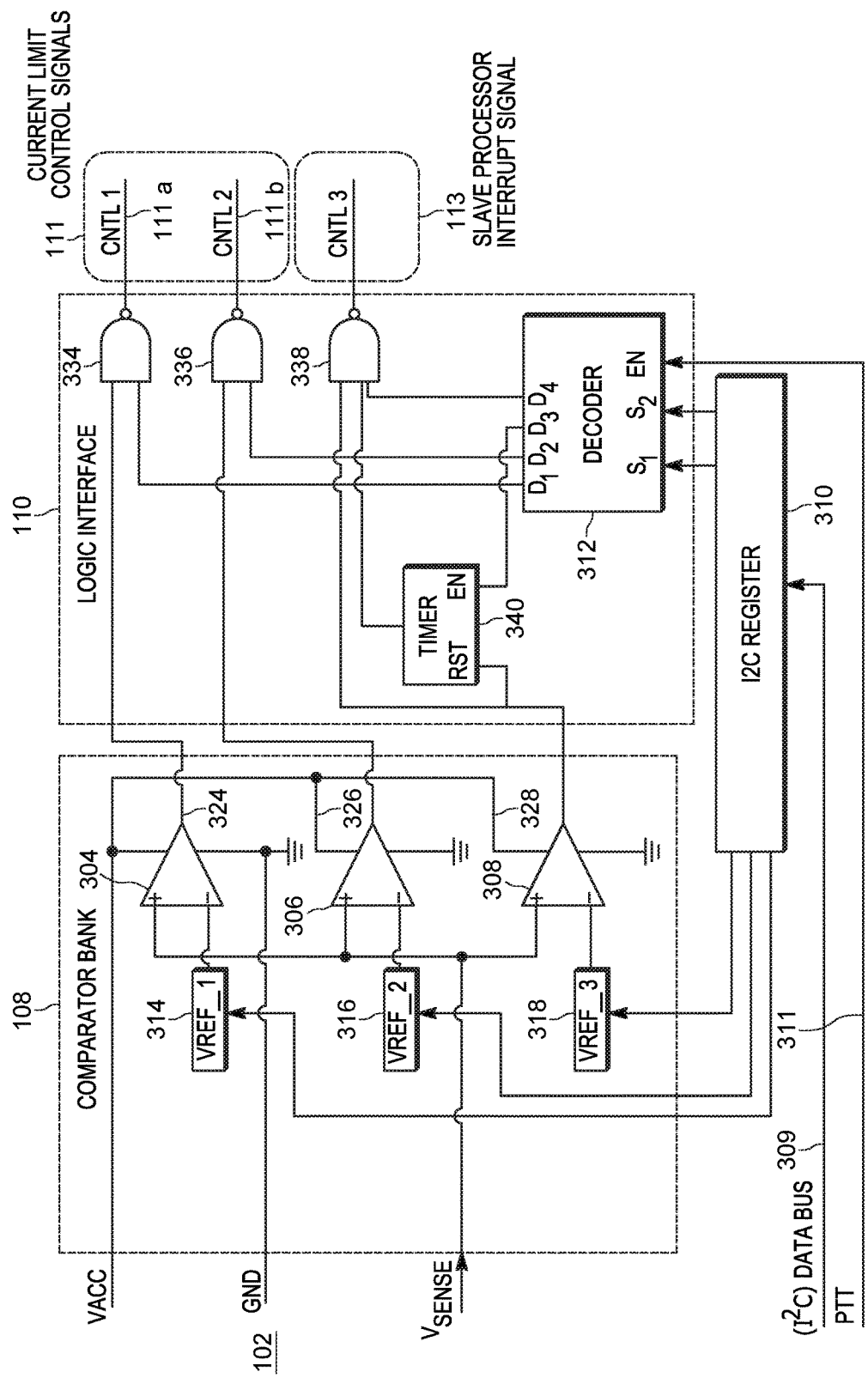
FIG. 3 is an example of a comparator bank and a logic interface for the portable communication device in accordance the first embodiment.

FIG. 3 is an example of an implementation of the composite comparator bank 108 and the logic interface 110 formed in accordance with the first embodiment. In accordance with the first embodiment, the comparator bank 108 is configured with a plurality of N comparators, and the logic interface 110 is configured with an array of logic gates 334, 336, 338.

In this first embodiment, the plurality of comparators comprises first, second, and third comparators 304, 306, 308

(analog-to-digital comparators) each having an input tied to the sensed battery voltage 103 and another input tied to respective voltage reference thresholds, Vref_1 (314), Vref_2 (316), Vref_3 (318). The analog comparator bank 108 generates digital output signals 324, 326, 328 based on the comparison of sensed battery voltage 103 to the respective voltage reference thresholds Vref_1 (314), Vref_2 (316), Vref_3 (318).

The voltage reference thresholds Vref_1 (314), Vref_2 (316), Vref_3 (318) may be adjustably set by the master processor (of FIG. 1) via a data bus interface 309 and a register 310. The data bus interface 309 may be an I²C interface, serial peripheral interface (SPI), or other appropriate interface used for attaching lower-speed peripheral integrated circuits to processors in short-distance, intra-board communication. The adjustable threshold voltage references, Vref_1 (314), Vref_2 (316), Vref_3 (318), may be internal or external to a comparator bank integrated circuit.

The logic interface 110 is enabled and disabled in response to a push-to-talk (PTT) status 311 decoded by a decoder 312. If PTT is asserted, then the logic interface is on. If PTT is de-asserted, then the logic interface 110 if off. When the PTT status 311 is asserted (on), the tripping of the individual logic gates 334, 336, 338 within the logic interface 110 is controlled based on outputs from the comparator bank 108 (one or more of the comparators 304, 306, 308 being tripped) along with a plurality of select control that selectively trip a gates 334, 336 within the gate array of logic interface 110. The slave interrupt signal 113 is enabled in response to a PTT assertion and one or more of the comparators of comparator bank 108 being tripped. A timer is also set for a predetermined time during which current limiting of high current primary devices, such as the Tax RFPA, is controlled. While shown as a single control line, it is intended that similarly logic and a plurality of control lines may be used to control the RFPA, wherein one control lie is asserted and a previous control line is de-asserted to provide for scaled current limiting.

Time hysteresis associated with the comparator bank 108 provides low pass filtering to the outputs of the comparators 304, 306, 308 which prevents an off-on-off (yo-yo) phenomena effect to the logic gates 334, 336, 338 potentially caused by relieving the current strain on the battery and then allowing the initial offending load to reclaim its original, higher current limit. For cases in which the high current load comprises the Tx RFPA, this low pass filter functionality also prevents envelope modulation (AM modulation) of the RF carrier from potentially occurring as the PA's current drain headroom is otherwise rapidly modulated between multiple levels.

The plurality of parallel logic gates 334, 336, 338 receive respective corresponding digital outputs 324, 326, 328 from the plurality of comparators 304, 306, 308 and also receive respective control signals (D1, D2, D4) from the decoder 312. The logic array generates current limit control signals 111a, 111b (CNTL1, CNTL2) from gates 334, 336. The logic array also generates a processor interrupt signal 113 (CNTL 3) from logic gate 338. The current limiter control signals 111a, 111b and interrupt signal 113 are also subject to time hysteresis to prevent an on-off-on phenomena. The signals are used in a binary mode to signal an "all clear" so that lower priority processes may resume full power operation.

From an operational standpoint, the programmable bank 108 of N comparators 314, 316, 318 is externally controlled by the master processor (shown as master processor 106 in FIG. 1) that can rapidly detect one of N distinct levels of transient drop in the battery's voltage and react to this voltage slump event by eliciting the following responses:

The set of N comparators 314, 316, 318 trip in an order of decreasing battery voltage. The comparators are designed so that their trip levels are programmable and the comparators are maskable.

The comparator bank 108 generates a set of digital outputs 324, 326, 328 that enable one of N parallel logic gates (with the others being disabled) in the logic circuit responsible for current limiter controls 111a, 111b, 113, CNTL 1, CNTL 2, CNTL 3.

The current limiter controls 111a, 111b (CNTL1, CNTL 2), operate as a current limit data bus for controlling the current limiter selection stage 112 of FIG. 1. The current limiter control 113 (CNTL 3) provides a processor interrupt to the slave processor 114 of FIG. 1.

The current limiter controls provide 111a, 111b (CNTL1, CNTL 2) provide controls to allow for the maximum permissible current drain of the high power circuit (the Tx RF PA) in proportion to the present voltage slump of the battery. The control of the current supply is performed in a manner to relieve the battery of the adverse slump by reducing the maximum overall current strain on the battery.

In accordance with the first embodiment, only a single path (CNTL 1, CNTL 2, or CNTL 3) shall be active, and this single path controls the current limiting selection stage 112 that sets the upper bound current limit for the primary load, such as the RF PA.

In accordance with the first embodiment, signals from the composite comparator bank 108 and logic interface 110 are used to alert one or more slave processors in the device of an excessive current loading event so that they may engage in mitigating action to further relieve the battery of excessive demand and hence allow the primary load to remain or be restored to its maximum designed current limit capability.

Table 1 represents an example of a sample truth table for a type 'A' battery at room temperature for a communication device formed and operating in accordance with the first embodiment. The comparator bank, such as comparator bank 108, has been programmed with voltage trip threshold levels based on the battery's profile and the state of other system parameters such as volume setting and slave processor status. Table 1 assumes a battery impedance of 200 milliohms and room temperature. The trip thresholds are provided as example and can be changed based on a variety of battery factors, such as type, temperature, and capacitance, to name a few.

The "ANALOG COMPARE INPUTS" of Table 1 comprise the sensed battery voltage, GPIO input or I²C parameters, such as audio volume level and temperature (temperature is not shown in the Table, but in this example is understood to be room temperature). The "ANALOG COMPARE INPUTS" are input to the programmable comparator bank 108. Outputs of the comparator bank 108 are digital outputs 324, 326, 328.

The DIGITAL GPIO INPUTS may comprise, for example, Audio PA enable, slave processor status, and volume setting as digital inputs to register 310 via I²C digital bus (alternatively these could also be GPIO inputs). The decoder 312 uses the settings in register 310 set by the master processor 106 to trigger the GPIO outputs as specified in Table 1.

The DIGITAL GPIO OUTPUTS control two levels of predetermined transmit RF PA current Limit settings (represented by control signals CNTL 1 and CNTL 2 in FIG. 3). In this example, the CNTL 1 signal may be set at 2 amps (TX PA 2A LIMIT) and the CNTL 2 signal may be set at 2.5 amps (TX PA 2.5A LIMIT). The predetermined current limit settings are represented as the current limit control signals 111a, 111b for controlling current limit selection stage 112.

TABLE 1

| ANALOG COMPARE | DIGITAL GPIO/I2C INPUTS | | | DIGITAL GPIO OUTPUTS | |
|---|---|---|---|---|---|
| INPUTS Battery Voltage | Vol > Rated Threshold | Audio PA Enabled | Slave Processor Ready | TX PA 2A LIMIT | TX PA 2.5A LIMIT |
| >7 V | — | NO | NO | FALSE | FALSE |
| >7 V | — | NO | NO | FALSE | FALSE |
| >7 V | — | NO | YES | FALSE | FALSE |
| >7 V | — | YES | NO | FALSE | FALSE |
| >7 V | — | YES | NO | FALSE | FALSE |
| >7 V | — | YES | YES | FALSE | FALSE |
| 6.6 V < Batt <7 V | — | NO | NO | FALSE | FALSE |
| 6.6 V < Batt <7 V | — | NO | NO | FALSE | TRUE |
| 6.6 V < Batt <7 V | — | NO | YES | FALSE | TRUE |
| 6.6 V < Batt <7 V | NO | YES | NO | FALSE | TRUE |
| 6.6 V < Batt <7 V | NO | YES | NO | TRUE | FALSE |
| 6.6 V < Batt <7 V | NO | YES | YES | FALSE | TRUE |
| 6.6 V < Batt <7 V | YES | YES | NO | FALSE | TRUE |
| 6.6 V < Batt <7 V | YES | YES | NO | TRUE | FALSE |
| 6.6 V < Batt <7 V | YES | YES | YES | TRUE | FALSE |
| <6.6 V | — | NO | NO | TRUE | FALSE |
| <6.6 V | — | NO | NO | TRUE | FALSE |
| <6.6 V | — | NO | YES | TRUE | FALSE |
| <6.6 V | NO | YES | NO | TRUE | FALSE |
| <6.6 V | NO | YES | NO | TRUE | FALSE |
| <6.6 V | NO | YES | YES | TRUE | FALSE |
| <6.6 V | YES | YES | NO | TRUE | FALSE |
| <6.6 V | YES | YES | NO | TRUE | FALSE |
| <6.6 V | YES | YES | YES | TRUE | FALSE |

Referring to the Table 1, a high battery voltage measurement, for example above 7 volts, results in a 'don't care' condition as to the status of the volume. The 'don't care' volume condition is represented by a dash (-) and is indicative of the battery having sufficient current to handle high LMR current conditions regardless of the speaker volume. Accordingly, under high voltage conditions, the transmitter PA and the audio PA can both draw current at the same time without the need for any limiting, while the slave processor 114 continues to run in parallel.

As the battery voltage begins to drop within a first predetermined voltage threshold, for example a threshold range of 6.6 volts to 7 volts, the Table 1 shows how current limiting begins to be applied to the predetermined high current drain LMR element. For example, the LMR transmit power amplifier (TX PA) may be current limited to a 2.5 amp limit. If the audio PA is turned on but without high volume, for example playing out a conventional alert tone, then the transmit PA can remain operational at the 2.5 amp current limit. If the audio PA begins to generate high volume audio alert tones or talk permit tones, then the current limiting to the transmit PA is brought down to another predetermined current limit, while still allowing the slave processor 114 to run in parallel. For example, the transmit PA may be enabled and current limited to 2 amps while the audio power amplifier plays loud audio, and the application processor continues to run LTE apps in parallel.

As the battery voltage drops below a second predetermined voltage threshold, for example 6.6 volts, the Table 1 shows how current limiting is applied to the transmit power amplifier at the 2 amp limit. If the audio PA is not enabled, then the slave processor 114 continues to run in parallel. However, if the audio PA turns on in conjunction with the transmit PA at this lower voltage threshold, then an interrupt control signal 113 is sent to the slave processor 114, thereby interrupting the processing of peripherals, such as LTE apps and WiFi. Once the TX PA has completed and/or the audio PA ceases loud audio, then the slave processor 114 can return to processing the peripheral applications, such as LTE apps and WiFi.

Figures 4, 5:
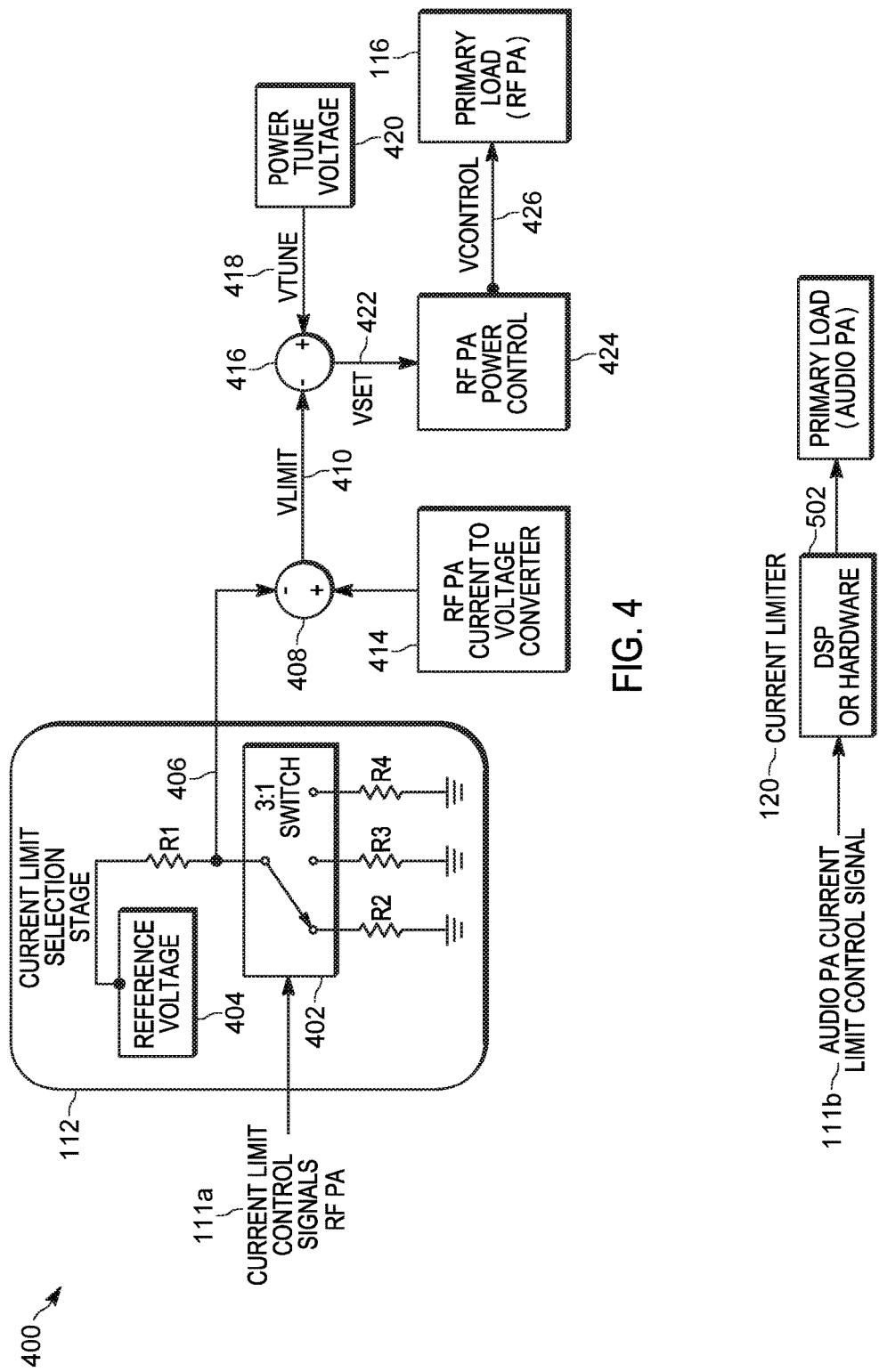
FIG. 4 is an example of a current limit selection stage coupled to a Tx RFPA for the portable communication device in accordance with the first embodiment.
FIG. 5 is an example of the current limiter for the Audio PA in accordance with the first embodiment.

FIG. 4 is an example of an implementation 400 of the current limit selection stage 112 coupled to a Tx RFPA 116 of FIG. 1 for the portable communication device in accordance with the first embodiment. The current limit selection stage 112 is preferably formed of a switched resistive network 402 powered by a reference voltage 404 (set to appropriately scale voltage to the range of a RFPA power control loop 424) and controlled by the current limit data control signal 111a. While shown as a three level current limit selection (R1 switchably coupled to R2, R3, R4), it is understood that additional current selectivity may also be implemented.

In operation, the switched resistive network 402 generates a voltage signal 406. The voltage signal 406 is input to a first subtract or 408 which generates a difference voltage 410 (Vlimit) when an output of a RFPA current to voltage converter 414 exceeds the level of voltage signal 406. A difference voltage 410 (Vlimit) is generated from the first subtractor 408 which is then input to a second subtractor 416 where it is subtracted from a tuning voltage 418 (Vtune), the tuning voltage being set while the Tx RFPA is power tuned 420. An output 422 (Vset) of the second subtractor 416 is delivered to a Tx RF PA power control circuit 424 that generates a control voltage 426 (Vcontrol) for powering the primary load 116 (the Tx RFPA). Thus, in accordance with the embodiments, the current limiter selection stage 112 scales the loading.

FIG. 5 is a block diagram of the current limiter 120 for the Audio PA 122 of FIG. 1 in accordance with the first embodiment. The Audio PA is considered one of the primary loads due to its high current draw during a transmit event in the form of audio alert tones. Control of the Audio PA current is provided by the current limit control signal 111b being input to the current limiter 120 for controlling current draw of the Audio PA 122. The current limiter 120 may be implemented in hardware or as part of a digital signal processor (DSP) 502. For example, a hardware configuration comprising a resistive network, such as that used for the RFPA could be used, or other hardware configuration. Alternatively, an Audio PA integrated circuit may have an internal current limiting section controlled by current limiter control signal 111b.

Figure 6:
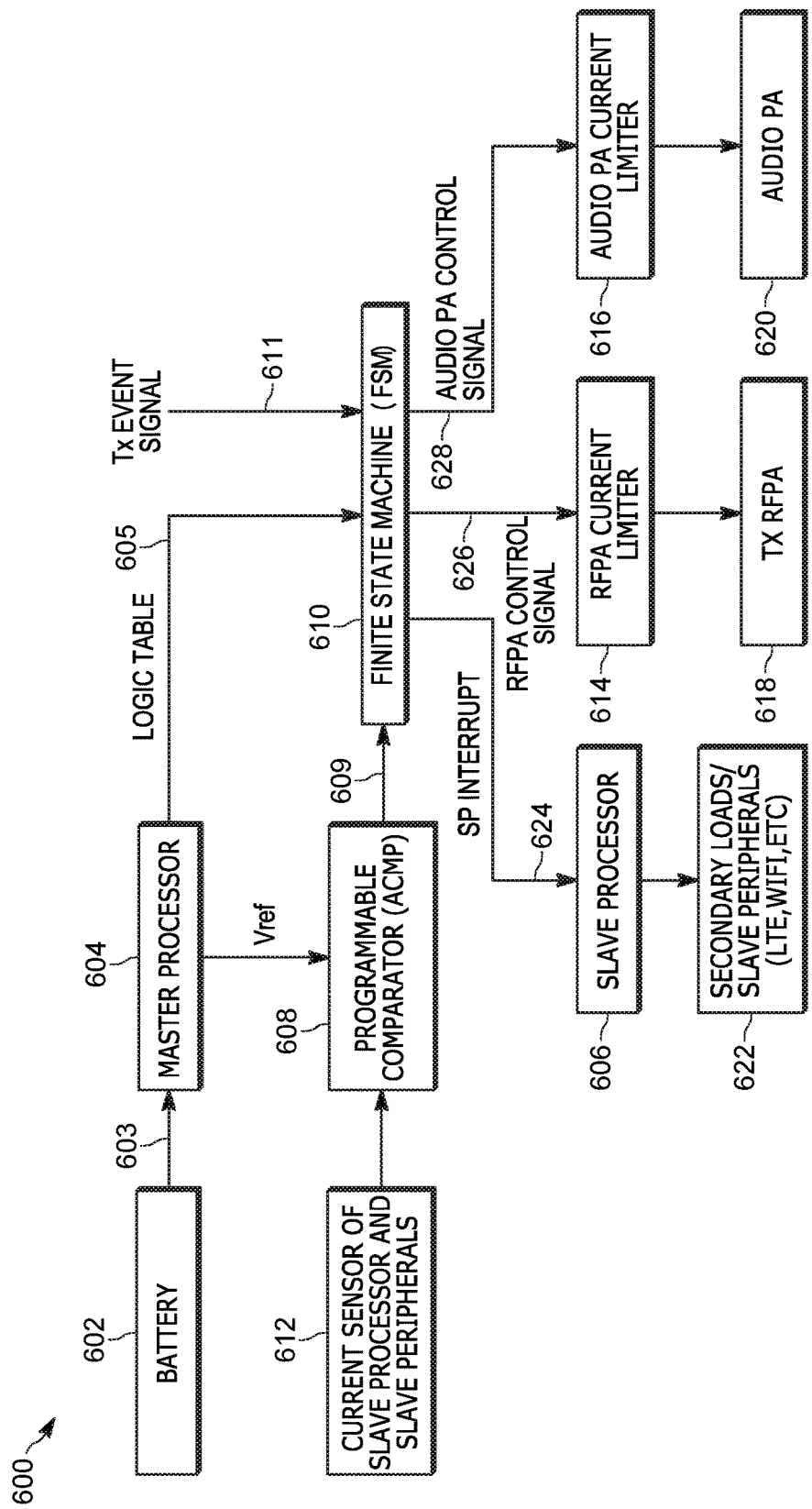
FIG. 6 is block diagram of a portable communication device formed and operating in accordance with a second embodiment.

FIG. 6 is block diagram of a portable communication device 600 formed and operating in accordance the second embodiment. The portable communication device 600 comprises a plurality of radio elements comprising a battery 602, a master processor 604, a slave processor 606, a programmable comparator 608, a finite state machine (FSM) 610, a plurality of current sensors 612, 614, 616, a plurality of primary loads (LMR loads) comprising a Tx RFPA and an Audio PA 620, and a plurality of secondary loads (non-LMR loads) comprising slave peripherals 622, such as LTE, WiFi, GPS, to name a few).

The portable communication device 600 is powered by the battery 602 having a battery profile associated therewith. The battery 602 supplies power, either directly or indirectly, to the plurality of radio elements. Portable communication device 600 operates as a converged device during a normal operating state providing both land mobile radio (LMR) functionality, such as Tx RFPA 618 and audio PA 620 (e.g. Tx alert tones) along with non-LMR functionality, in the form of slave peripheral functionality 622. In accordance with the second embodiment, other operating states, such as a maximum current limit operating state and a moderate current limit operating state, are enabled which control current limiting of the LMR and non-LMR functionalities in response to a transmit even, which would otherwise result in an over current condition.

The master processor 604 provides a reference voltage (Vref) to the comparator 608 and a logic table to the FSM 610 based on the battery profile. In accordance with the second embodiment, the comparator 608 is a single analog-to-digital comparator. The reference voltage (Vref) is input to comparator 608 for comparison with a current sense voltage input generated as a result of a current sensor of the slave processor and slave peripherals 612. The programmable comparator 608 generates a digital output (ACMP output) 609 which is applied to the finite state machine 610 in conjunction with transmit event status signal 611 for controlling a selection of a current limit operating state (normal operating, moderate current limit state, maximum current limit state) from the logic table. Only a transmit event 616 (physical or logical), such as an LMR PTT press, will initiate a change of state from normal operating state to maximum current limit state in the finite state machine (FSM) 610. The FSM 610 preferably provides for a plurality of operating states for the portable communication device 600. For example, three discrete operating states may be provided comprising: a normal operating state, a moderate current limiting operating state, and a maximum current limiting operating state, which will later be described in further detail.

The finite state machine (FSM) 610 produces a plurality of FSM output control signals 624, 626, 628, also referred to as slave processor (SP) interrupt 624, Tx RFPA control signal 626, and Audio PA control signal 628. The plurality of control signals 624, 626, 628 are generated based on the logic table of the FSM 610 defining the operating states, the operating states being controlled (asserted and de-asserted) by the comparator output signal 609.

As an example, the finite State machine (FSM) 610 will transition from a normal operating state to a maximum current limiting state in response to a Tx event signal 611 in the form of a PTT press. In this maximum current limiting state, the slave processor (SP) interrupt signal 624 will be asserted to current limit the slave peripherals 622 and additionally all of the high current draw blocks comprising LMR mission critical primary loads including Tx RFPA 618 and Audio PA 620 are current limited as a precaution in case the slave processor 606 and/or its slave peripherals 622 do not react in time to the slave processor interrupt signal 624. The FSM 610 will remain in this maximum current limiting state until a predetermined short time delay, set by a timer, has expired and the comparator output 609 has gone low. The comparator output 609 going low indicates that the slave processor 606 and/or its slave peripherals 622 have decreased their current draw enough to allow for full power primary load operation allowing the device 600 to transaction to a moderate current limit state. The timer prevents states from changing too quickly and causing timing/transient response issues.

The moderate current limit state deasserts current limiting of the RF PA so as to not degrade the mission critical RFPA functionality, while maintaining the current limiting of the Audio PA620 (limited or no audio alert tones) and slower operation or no operation of the slave peripherals 622.

Transitioning back to a normal operating state from either of the other two states (maximum and moderate) occurs whenever the transmit event concludes regardless of the comparator output 609 or timer expirations. Transitioning to the normal operating state deasserts all of the current limiting control signals, thereby reinstating full converged operation.

Figure 7:
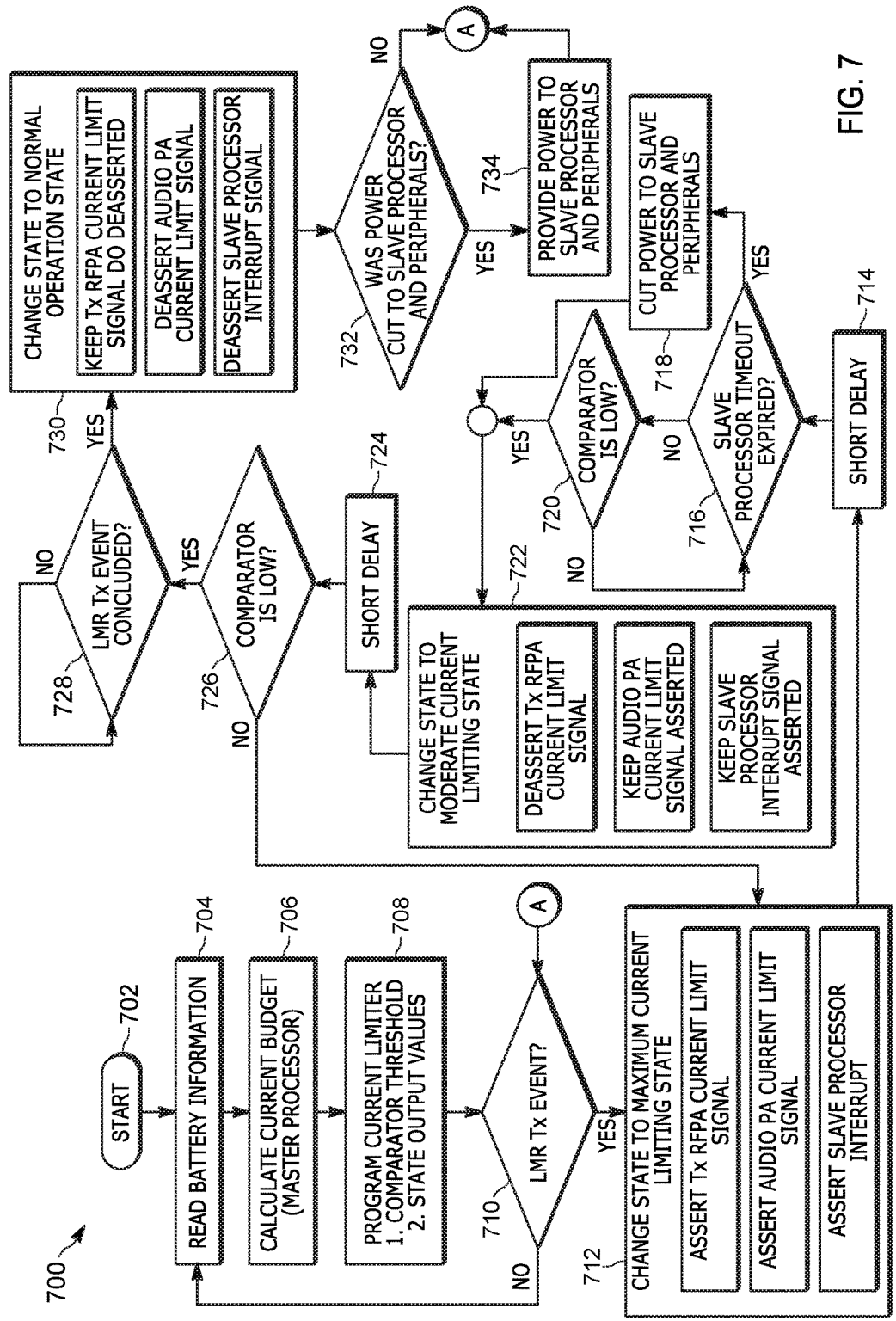
FIG. 7 is a flowchart of a method for managing the portable communication device in accordance with the second embodiment.

FIG. 7 is a flowchart of a method 700 for managing the battery operated portable communication device in accordance with the second embodiment. The method 700 advantageously allows LMR operation and peripheral functionality, such as non-LMR LTE, WiFi, and GPS processes, to be managed in a parallel and seamless manner which avoids resets to the radio. Briefly, in accordance with the second embodiment, when a transmit event occurs the device goes into a maximum current limit state and then reads the current sensing of the slave processor secondary loads to determine whether to change states or remain in the maximum current limiting state. In the previously described first embodiment, on the other hand, current limiting action is taken when both a transmit event occurs and the comparator trips.

In the second embodiment, the current limiter does not trip or take action until a Tx event occurs. Except for reading battery information, there is no tapping off of the battery in the second embodiment as was done in the first embodiment.

The method 700 starts at 702 by reading battery information at 704 and having the master processor calculate a current budget at 706. The master processor then programs a comparator threshold for the single comparator as well as state values for a finite state machine, such as the FSM of FIG. 6, at 708. The method waits for a transmit event to occur at 710, and continues monitoring the battery information, calculating current budget and dynamically programming the current limiter threshold and state output values, until a transmit event does occur at 710.

In response to a transmit event occurring at 710, the method provides for changing operating states to a maximum current limiting state at 712. During the maximum current limiting state, the FSM sends a plurality of FSM output control signals which assert a TX RF PA current limit control, assert an audio PA current limit control signal, and assert a slave processor interrupt control signal. The maximum current limiting state provides for the most current cut back.

The maximum current limiting state will operated for, at least a short predetermined time delay, preprogrammed into a timer, at 714. A determination is then made as to whether the slave processor timeout timer has expired at 716. When the slave processor timeout timer has expired at 716, then the slave processor and its associated slave peripherals are powered down at 718. This mechanism is a failsafe that ensures that if, for any reason, the slave processor does not respond to the slave processor interrupt, then the master processor can cut power to the slave processor and it's secondary loads in order to ensure mission critical LMR transmit operation can proceed without causing an overcurrent condition. When the slave processor timeout timer has not expired at 716, then a check is made to determine if the single comparator, that is the comparator 608 of FIG. 6, has gone low at 720.

In response to the single comparator going low at 720, or in response to the slave processor peripherals being shut down at 718, the method progresses to change operating states to a moderate current limiting state at 722. The moderate current limit operating state at 722 de-asserts the Tx RFPA current limit signal, keeps the Audio PA current limit signal asserted, and keeps the slave processor interrupt signal asserted.

The moderate current limiting state is maintained over a predetermined short time delay at 724, and the single comparator is then checked again to determine if its output has remained low. If the comparator output has not remained low, the current limiting is returned back to the maximum current limiting state at 712. If the comparator output remains low at 726, then the method proceeds to 728 to determine if the transmit event (Tx event) has concluded.

Once the transmit (TX) event has concluded at 728, the method changes state to a normal operation at 730. The normal operation state at 730 keeps the Tx RFPA current limit control signal asserted, de-asserts the audio PA current limit control signal, and de-asserts the slave processor interrupt control signal. Upon transitioning to the normal operating state, a determination is made at 732 as to whether the slave processor and peripherals were powered down previously, and if so, then the power is reconnected at 734. The method then returns to monitor for another transmit event at 710.

Accordingly, method 700 provides a method for rapidly and dynamically adjusting current limiting in a portable communication device. The method advantageously monitors for transmit events (physical or logical) to initiate a change of operating states. While the plurality of operating states have been described as being implemented with three operating states (maximum, moderate, normal), the method and apparatus can be adjusted for an increased number of states to accommodate a variety of high power operating modes and a plurality of high power draw elements.

Figure 8:
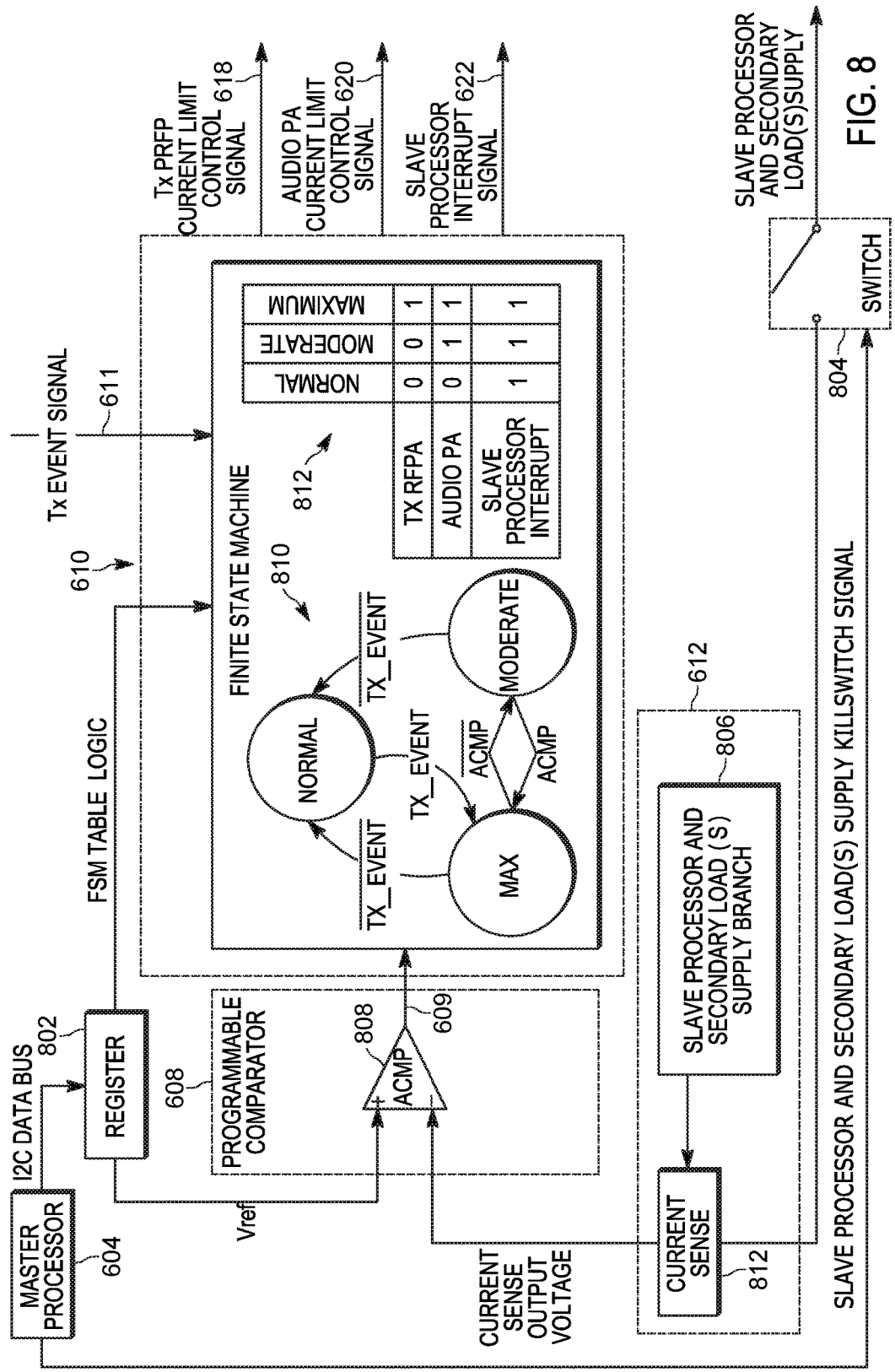
FIG. 8 is an example of a single comparator and finite state machine for the portable communication device in accordance the second embodiment.

FIG. 8 is a further detailed implementation of the comparator 608 and finite state machine (FSM) 610 of FIG. 6 for the portable communication device 600 in accordance with the second embodiment. The comparator 608 comprises a single programmable analog-to-digital comparator 808 which is programmed with the voltage reference threshold (Vref). The voltage reference threshold (Vref) is programmed to the single comparator 808 via a databus, such as an I²C databus or other interface, and a register 802. The single comparator 808 compares the voltage reference threshold (V_ref) to a sensed current draw voltage. The sensed current draw voltage is based on the current sensed at a supply branch associated with the slave processor and its peripheral secondary loads 612, which are shown in FIG. 8 as supply branch 806 and current sensor 812. The single comparator 808 compares the voltage reference threshold (V_ref) to the sensed current draw voltage and generates a comparator output (ACMP output 609) which is a digital signal. The digital ACMP output signal is an input to the finite state machine (FSM) 610. In the second embodiment, the single comparator 808 does not initiate the change of state from normal operating state to maximum current limit, only a transmit event (physical or logical) 342 can initiate a change of state from normal operating state to maximum current limit in the finite state machine (FSM) 610.

The FSM 610 is embodied as a three state, finite state machine 810 providing for three discrete states: a normal operating state, a moderate current limiting operating state, and a maximum current limiting operating state. The three states operate as a logic table (Table 2) that is preprogrammed by the master processor 604. Table 2 is also shown in FIG. 8.

TABLE 2

|  | Normal Operating State | Moderate Current Limiting State | Maximum Current Limiting State |
|---|---|---|---|
| TX RFPA | 0 | 0 | 1 |
| Audio PA | 0 | 1 | 1 |
| Slave Processor Interrupt | 1 | 1 | 1 |

*0 = No Limiting
1 = Limiting

Once a transmit event signal 611 is detected, the state machine 610 will transition from normal operating state to a maximum current limiting state. In the maximum current limiting state, the slave processor interrupt signal 622 will be asserted and all of the high current draw blocks will be current limited (included LMR mission critical primary loads) as a precaution in case the slave processor and/or its peripherals do not react in time to the slave processor interrupt signal 622. The three state, finite state machine 810 will remain at the maximum current limit state until the single comparator 808 trips (output goes LOW), indicating that the supply branch of the slave processor and/or its slave peripherals 806 have decreased their current draw, as sensed at current sensor 812, enough to allow for full power primary load operation, and a preprogrammed delay (timer) has expired (to prevent states from changing too quickly and causing timing/transient response issues).

Once the comparator output goes LOW and the maximum current limiter state timer has expired, the state machine will then transition to the moderate current limiting state. In this state, the Audio PA, slave processor and/or its slave peripherals will remain current limited but the current limit on the Tx RFPA will be removed so that it can operate at full power and not affect performance.

The transition from normal to maximum to moderate all occurs in a short predetermined timeframe, such as a millisecond timeframe, and well before the Tx RFPA ramps up to perform it's transmit event 611. This ensures that there is no effect on the performance of the transmit event.

If, while in the maximum current limiting state, the comparator output never goes LOW within a preprogrammed slave processor timeout timer window (because the slave processor and/or its slave peripherals did not properly limit their current), then the master processor 604 will cut the power to the slave processor and its peripherals 612 in order to maintain mission critical functionality. The slave processor and its slave peripherals 612 will then remain off until the transmit event concludes.

If, while in the moderate current Limiting state, the comparator output goes from LOW to HIGH indicating that the slave processor and/or its peripherals 806 is drawing more current than it should be, then the finite state machine 810 will transition from moderate back to maximum current limiting.

The state machine will only drop back down to a normal operating state once the transmit event has concluded.

Figure 9:
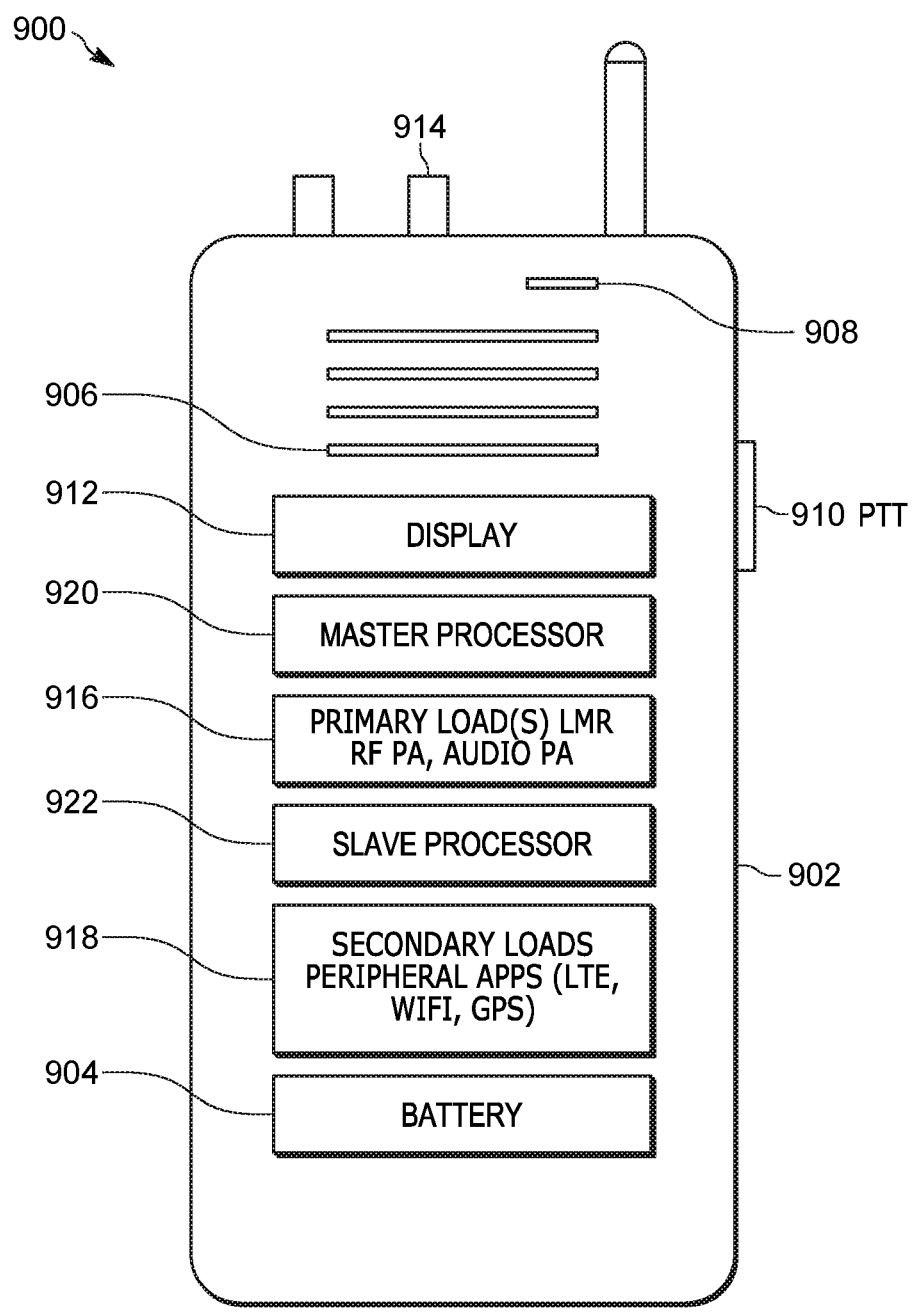
FIG. 9 is a portable communication device formed and operating in accordance with either the first embodiment or the second embodiment.

FIG. 9 is a portable communication device 900 formed and operating in accordance with the embodiments. The portable communication device 900 provides a portable radio 902 powered by a battery pack 904 and provides user interface features such as a speaker 906, a microphone 908, a push-to-talk (PTT) button 910, a display 912, and controls knobs 914 (for volume, channel change and voice control). Portable communication device 900 provides a converged device comprising primary loads of land mobile radio (LMR) functions 916 along with secondary loads of non-LMR processes 918. The LMR functionality and particularly high power elements of the LMR functionality, such as the Tx RFPA and audio PA (e.g. Tx alert tones) are controlled by master processor 920 and are considered to be the primary loads 916 of the portable radio 902. The peripheral applications operate as secondary loads 918 and may comprise, for example, long term evolution (LTE), WiFi, and GPS applications under the control of slave processor 922.

The LMR functionality of portable radio 902 provides a simplex (half duplex) mode of operation in which pressing the PTT button 910 enables high power transmit mode and releasing the PTT causes the device to revert to receive/standby mode. The LMR mode may also incur high current drain when loud audio is being played out of speaker 906, such as Audio Transmit Talk Tones—which are usually, but not limited to, pure sinusoidal audio signals of a predetermined frequency being played out during a PTT press. In accordance with the embodiments, the portable communication device 900 can run the LMR and non-LMR applications in parallel and provide resolution to potential conflicts caused by high current spikes occurring during high power operation of LMR. The portable communication device 900 is able to maintain or restore high current to mission critical functions, such as transmit and loud audio, in a seamless manner without either having the device reset nor displaying pre-mature indicators of low battery status due to high current transient fluctuations.

Accordingly, there has been provided an apparatus, method, and device with dynamically adjusting current limiting in a portable communication device. The scaled manner of current limiting of the various embodiments ensures that high power mission critical LMR functions remain operational, even when running in parallel with other non-mission critical functions. Rather than using cut-off mechanisms or just one battery factor, the approach provides for scaling of the loading according to the capabilities of the battery. The first embodiment provided for current limiting action to take place in response to both the PTT being pressed and a comparator of the comparator bank being tripped. The second embodiment provided current limiting action to take place by putting the device into a maximum current limit state in response to the PTT being pressed and then reading the current sensing of the slave processor secondary loads to determine whether to change states or remain in the maximum current limiting state. The single comparator of the second embodiment is used for sensing current spikes slave processor and secondary loads.

The various embodiments facilitate small size implementation on a printed circuit board (PCB) and thus are very cost effective. The dynamic current limiting advantageously provides a means for prioritizing mission critical functionality. While the RF PA transmitter is considered mission critical, it is also the number one contributor to excessive current loading. The approaches provided by the embodiments provide for prioritization of mission critical functions by buying time for the slave processors(s) to reduce functionality on non-mission critical processes in the radio, for example a WiFi upload) thereby reducing transmit power and hence slowing the upload until the excessive current drain has been abated. By reducing non-mission critical current drain consumption, the RF PA current limit will be automatically restored to a predetermined maximum possible level within milliseconds, thus maintaining a high degree of communication capability. The approach avoids the use of a contact-current current control with its current limit permanently set much lower than a voice class only device. No changes to user interface operation of the portable communication device are required.

The approaches provided by the embodiments facilitate the implementation of converged devices, and advantageously address the problem of converged devices being powered by a battery with insufficient capacity to operate all functions in parallel. The embodiments provide for a combination of peripheral functions in a modern LMR radio. A portable communication device formed in accordance with either embodiment is able to maintain or restore high current to mission critical functions, such as transmit and loud audio, in a seamless manner without either having the device reset nor displaying premature indicators of low battery status due to transient fluctuations in battery voltage caused by peak current events and the subsequent IR drop across the internal impedance of the battery.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A portable communication device, comprising:
   a battery;
   a push-to-talk (PTT) button for asserting a transmit event signal;
   a master processor for controlling current limiting of primary loads of the portable communication device;
   a slave processor for controlling secondary loads;
   a finite state machine (FSM) defining a plurality of current limit operating states for the portable communication device based on a battery profile of the battery;
   a comparator programmed by the master processor with a reference voltage based on the battery profile, the comparator comparing the reference voltage to a current sense output voltage sensed at the slave processor and the secondary loads, the comparator generating a comparator output signal for input to the finite state machine; and
   wherein
   the finite state machine (FSM) receives the comparator output signal and the transmit event signal and determines a discrete operating state of the plurality of current limit operating states, the FSM generating a plurality of current limit control signals in response thereto for controlling the primary and secondary loads in accordance with the determined discrete operating state.

2. The portable communication device of claim 1, wherein the plurality of current limit operating states comprise at least:
   a normal operating state without current limiting;
   a moderate current limit operating state; and
   a maximum current limit operating state.

3. The portable communication device of claim 2, wherein in the normal operating state the portable communication device operates as a converged device providing both land mobile radio (LMR) functionality along with non-LMR processes, the non-LMR processes being controlled by the slave processor.

4. The portable communication device of claim 3, wherein the maximum current limit operating state and the moderate current limit operating state control current limiting of the LMR functionality and non-LMR processes in response to a transmit event, which would otherwise result in an over current condition.

5. The portable communication device of claim 3, wherein the LMR functionality is provided by a Tx RFPA and a transmit audio PA, and wherein the maximum current limiting state is configured to:
   assert a transmit radio frequency power amplifier (Tx RFPA) current limit;
   assert a transmit audio power amplifier (Tx Audio PA) current limit; and
   assert a slave processor interrupt.

6. The portable communication device of claim 5, wherein the moderate current limiting state is configured to:
   deassert the Tx RFPA current limit;
   keep the Tx audio PA current limited; and
   keep the slave processor interrupt asserted.

7. The method of claim 6, wherein the normal operating state is configured to:
   keep the Tx RFPA current limit deasserted;
   deassert the Tx audio PA current limiting; and
   deassert the slave processor interrupt.

8. A portable communication device, comprising:
   a battery having a battery profile;
   a master processor for controlling primary loads;
   a slave processor for controlling secondary loads, and wherein primary load operations and secondary load processes operate in parallel during a normal mode state;
   a current sensor for sensing current of the slave processor and slave processor secondary loads;
   a comparator coupled to the master processor, the comparator being programmed with a voltage threshold based on the battery profile, the comparator comparing the voltage threshold to a current sense voltage of the slave processor and slave processor secondary loads; and
   a finite state machine (FSM) coupled to the comparator, the finite state machine (FSM) receiving the comparator output signal and a transmit event signal and determining a discrete operating state of the plurality of operating states, the FSM generating a plurality of current limit control signals in response thereto for controlling the primary and secondary loads in accordance with the determined discrete operating state.

9. The portable communication device of claim 8, further comprising:
a preprogrammed delay timer for maintaining an enabled current limit state for a predetermined delay time.

10. The portable communication device of claim 8, wherein the primary load comprises at least:
a land mobile radio (LMR) radio frequency power amplifier (RFPA); and
an audio PA.

11. The portable communication device of claim 10, wherein the secondary load comprises at least one of:
a long term evolutions (LTE) feature;
a WiFi feature; and
a GPS feature.

12. The portable communication device of claim 8, wherein a maximum current limit state is initiated in response to a PTT assertion, and the maximum current limit state remains enabled until the comparator trips indicating that the slave processor and secondary loads have decreased current draw, as sensed at the current sensor, enough to allow for full power primary load operation.

13. The portable communication device of claim 12, wherein the finite state machine transitions from the maximum current limiting state to a moderate current limiting state in response to an output of the comparator output tripping, and a preprogrammed delay timer expiring.

14. The portable communication device of claim 13, wherein the finite state machine transitions from the moderate current limiting state back to the maximum current limiting in response to the comparator output tripping again indicating an increase in current draw.

15. The portable communication device of claim 8, wherein the state machine only transitions back to a normal operating state once the transmit event has concluded.

16. The portable communication device of claim 8, wherein the current limit control signals control a switched resistive network for current limiting the primary loads.

17. The portable communication device of claim 8, wherein the current limit control signals control a digital signal processor (DSP) for current limiting the primary loads.

\* \* \* \* \*